(12) United States Patent
Sheng

(10) Patent No.: US 11,600,438 B2
(45) Date of Patent: Mar. 7, 2023

(54) INDUCTOR AND METHOD FOR PRODUCING THE SAME

(71) Applicant: Murata Manufacturing Co., Ltd., Kyoto-fu (JP)

(72) Inventor: Jianxin Sheng, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 939 days.

(21) Appl. No.: 16/438,291

(22) Filed: Jun. 11, 2019

(65) Prior Publication Data

US 2019/0392987 A1    Dec. 26, 2019

(30) Foreign Application Priority Data

Jun. 20, 2018 (JP) .............................. JP2018-117245
Jan. 25, 2019 (JP) .............................. JP2019-011331

(51) Int. Cl.
*H01F 27/28* (2006.01)
*H01F 41/02* (2006.01)
(Continued)

(52) U.S. Cl.
CPC ........... *H01F 41/02* (2013.01); *B29C 43/003* (2013.01); *H01F 17/04* (2013.01);
(Continued)

(58) Field of Classification Search
USPC ................................. 336/221, 232, 192, 198
See application file for complete search history.

(56) References Cited

U.S. PATENT DOCUMENTS 10,600,560 B2     3/2020  Masuda et al.
2004/0246090 A1  12/2004  Matsutani et al.
(Continued)

FOREIGN PATENT DOCUMENTS

CN       1574127 A    2/2005
CN     204668122 U    9/2015
(Continued)

OTHER PUBLICATIONS

An Office Action mailed by China National Intellectual Property Administration dated Dec. 3, 2021 which corresponds to Chinese Patent Application No. 201910469079.5 and is related to U.S. Appl. No. 16/438,291 with English language translation.
(Continued)

*Primary Examiner* — Shawki S Ismail
*Assistant Examiner* — Kazi S Hossain
(74) *Attorney, Agent, or Firm* — Studebaker & Brackett PC

(57) ABSTRACT

An inductor includes an element containing a magnetic metal powder and a resin, a coil that includes a winding portion and paired extended portions extended from both ends of the winding portion and that is embedded in the element, a pair of an external terminal electrically connected to one of the extended portions and an external terminal electrically connected to the other of the extended portions, and a conductive layer disposed on a surface of the element that crosses the winding axis of the coil. The conductive layer includes a first metal layer formed by fusing together the magnetic metal powder near the surface of the element and a second metal layer formed by plating on the first metal layer. The electrical resistivity of the second metal layer is lower than the electrical resistivity of the first metal layer.

19 Claims, 6 Drawing Sheets

(51) Int. Cl.
  *H01F 17/04*  (2006.01)
  *H01F 27/29*  (2006.01)
  *H01L 49/02*  (2006.01)
  *B29C 43/00*  (2006.01)
  *H01F 27/36*  (2006.01)
  *B29K 303/06* (2006.01)

(52) U.S. Cl.
  CPC ....... *H01F 27/2847* (2013.01); *H01F 27/292* (2013.01); *H01F 27/363* (2020.08); *H01L 28/10* (2013.01); *B29K 2303/06* (2013.01); *H01F 2017/048* (2013.01)

(56) References Cited

U.S. PATENT DOCUMENTS

| | | | | |
|---|---|---|---|---|
| 2009/0096783 | A1* | 4/2009 | Shpunt | G06V 20/00 |
| | | | | 348/E13.001 |
| 2015/0318105 | A1 | 11/2015 | Lee et al. | |
| 2017/0178793 | A1 | 6/2017 | Muneuchi | |
| 2017/0229234 | A1* | 8/2017 | Lee | H01F 17/04 |
| 2017/0309394 | A1 | 10/2017 | Blow et al. | |
| 2018/0247764 | A1* | 8/2018 | Muneuchi | C22C 32/0094 |

FOREIGN PATENT DOCUMENTS

| | | |
|---|---|---|
| CN | 105047359 A | 11/2015 |
| CN | 108028122 A | 5/2018 |
| JP | 2005-005287 A | 1/2005 |
| JP | 2014-199944 A | 10/2014 |
| JP | 2016-058418 A | 4/2016 |
| JP | 2017-011256 A | 1/2017 |
| JP | 2017-076796 A | 4/2017 |

OTHER PUBLICATIONS

An Office Action; "Notice of Reasons for Refusal," mailed by the Japanese Patent Office dated Oct. 5, 2021, which corresponds to Japanese Patent Application No. 2019-011331 and is related to U.S. Appl. No. 16/438,291 with English translation.

* cited by examiner

INDUCTOR AND METHOD FOR PRODUCING THE SAME

CROSS-REFERENCE TO RELATED APPLICATIONS

This application claims benefit of priority to Japanese Patent Application No. 2018-117245, filed Jun. 20, 2018, and to Japanese Patent Application No. 2019-011331, filed Jan. 25, 2019, the entire content of each is incorporated herein by reference.

BACKGROUND

Technical Field

The present disclosure relates to an inductor and a method for producing the inductor.

Background Art

Electronic components including a coil embedded in an element formed of a composite containing a resin material and a metal powder are known.

In an inductor including a coil contained in an element formed of a composite containing a magnetic powder and a resin, the composite has low relative permeability, and the leakage flux, which is magnetic flux that leaks outside the element, emerges as a problem. The leakage flux is a cause of emission noise, which is emitted from the inductor. As a way of reducing the leakage flux, disposing a metal casing as the exterior of the element is known (e.g., see U.S. Patent Application Publication No. 2017/0309394). In such a structure, the leakage flux causes an eddy current in the metal casing, thereby reducing the leakage flux. However, disposing a metal casing as the exterior increases the external dimensions of the element.

SUMMARY

Accordingly, the present disclosure provides an inductor with less leakage flux and that can be miniaturized. An inductor according to preferred embodiments of the present disclosure includes an element containing a magnetic metal powder and a resin, a coil that includes a winding portion and paired extended portions extended from both ends of the winding portion and that is embedded in the element, a pair of an external terminal electrically connected to one of the extended portions and an external terminal electrically connected to the other of the extended portions, and a conductive layer disposed on a surface of the element that crosses the winding axis of the coil. The conductive layer includes a first metal layer formed by fusing together the magnetic metal powder near the surface of the element and a second metal layer formed by plating on the first metal layer. The electrical resistivity of the second metal layer is lower than the electrical resistivity of the first metal layer.

According to preferred embodiments of the present disclosure, an inductor with less leakage flux and that can be miniaturized can be provided.

Other features, elements, characteristics and advantages of the present disclosure will become more apparent from the following detailed description of preferred embodiments of the present disclosure with reference to the attached drawings.

DETAILED DESCRIPTION

Figure 1:
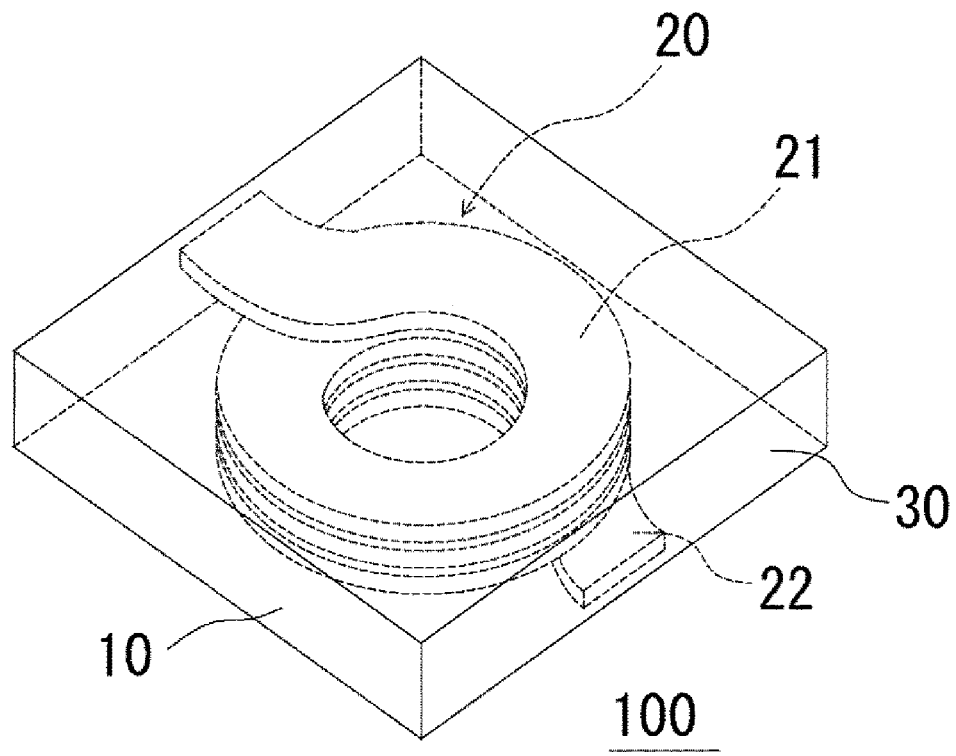
FIG. 1 is a schematic, partially transparent perspective view of an inductor in Example 1.

An inductor according to the present embodiment includes an element containing a magnetic metal powder and a resin, a coil that includes a winding portion and paired extended portions extended from both ends of the winding portion and that is embedded in the element, a pair of an external terminal electrically connected to one of the extended portions and an external terminal electrically connected to the other of the extended portions, and a conductive layer disposed on a surface of the element that crosses the winding axis of the coil. The conductive layer includes a first metal layer formed by fusing together the magnetic metal powder near the surface of the element and a second metal layer formed by plating on the first metal layer. The electrical resistivity of the second metal layer is lower than the electrical resistivity of the first metal layer.

The first metal layer may be formed inside the element. This further reduces the leakage flux.

The conductive layer may be disposed to overlap at least a portion of the winding portion of the coil when viewed in a direction of the winding axis of the coil. This further reduces the leakage flux.

The conductive layer may be disposed inward of the outer periphery of the winding portion of the coil when viewed in the direction of the winding axis of the coil. This further reduces the leakage flux.

The conductive layer may include a substantially annular conductive layer disposed between the outer periphery and the inner periphery of the winding portion of the coil when viewed in the direction of the winding axis of the coil. This enables a reduction in the leakage flux and suppression of degradation of the inductor characteristics.

The conductive layer may include a plurality of substantially annular conductive layers that do not cross each other. This enables a reduction in the leakage flux and suppression of degradation of the inductor characteristics.

The plurality of substantially annular conductive layers may be electrically connected to each other. This improves productivity of forming the conductive layers.

The inductor may further include a ground terminal to be connected to a ground of a substrate where the inductor is to be mounted, the conductive layer may be electrically connected to the ground terminal. This effectively reduces the electric field noise.

The inductor may further include an insulating layer covering the conductive layer. This suppresses oxidation of the conductive layer, thereby improving reliability.

A method according to the present embodiment for producing an inductor includes forming an element by embedding a coil including a winding portion and paired extended portions extended from both ends of the winding portion in a composite containing a magnetic metal powder and a resin, forming a first metal layer on a surface of the element that crosses the winding axis of the coil, the first metal layer being formed by melting and fusing together the magnetic metal powder near the surface of the element, and forming a second metal layer on the first metal layer. This provides an inductor with less leakage flux and that can be miniaturized.

Hereinafter, embodiments of the present disclosure will be described with reference to the drawings. The following embodiments describe exemplary inductors for realizing the technical idea of the present disclosure, and the present disclosure is not limited to the inductors described hereinafter. Members described in the claims are not limited to the members in the embodiments. In particular, the features, such as the size, material, shape, and relative arrangement, of components in the embodiments are not intended to limit the scope of the present disclosure to such components unless stated otherwise and are merely examples. In the drawings, the same components are denoted by the same symbols. Considering the easiness of describing the essential points and the easiness of understanding, the embodiments are separately described as a matter of convenience. Structures described in different embodiments can be partially substituted or combined with each other. The descriptions about the features in Example 2 and subsequent Examples that are identical to the features in Example 1 are omitted, and only different features are described. In particular, the same advantage due to the same structure is not described in each embodiment.

EXAMPLES

Example 1

Figure 2:
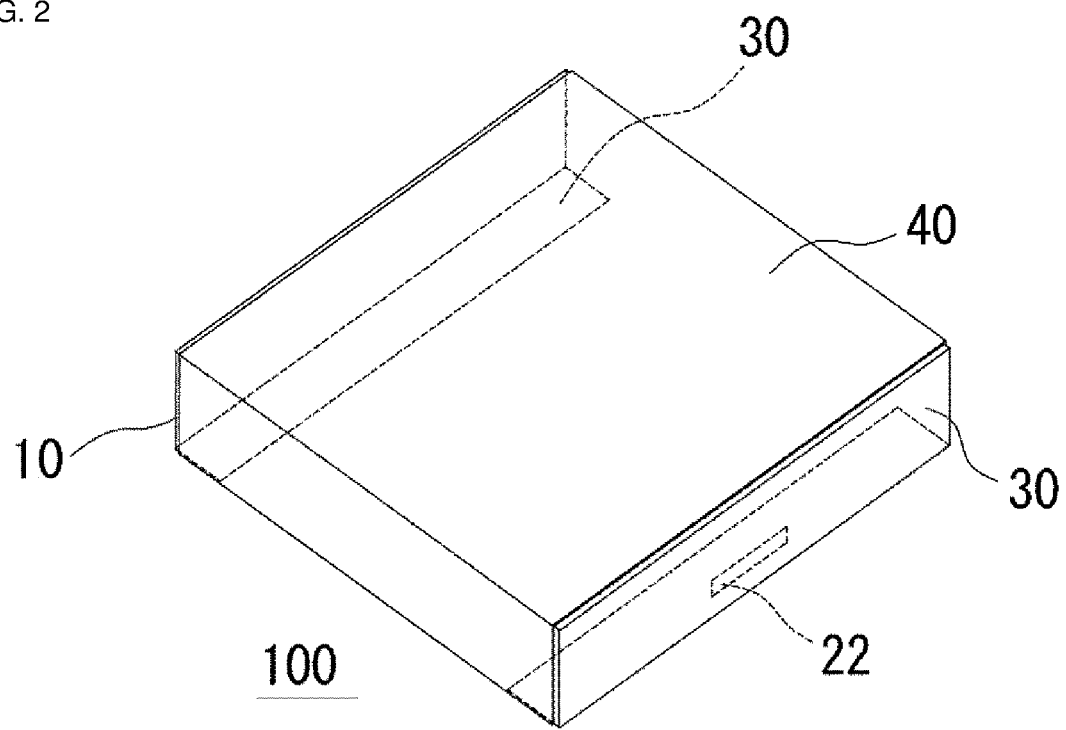
FIG. 2 is a schematic, partially transparent perspective view of the inductor illustrated in FIG. 1.

An inductor 100 in Example 1 will be described with reference to FIG. 1 to FIG. 4. FIG. 1 is a schematic, partially transparent perspective view of an exemplary inner structure of the inductor 100 in Example 1. FIG. 2 is a schematic, partially transparent perspective view of the external appearance of the inductor.

As illustrated in FIGS. 1 and 2, the inductor 100 includes an element 10 containing a magnetic metal powder and a resin, a coil 20 embedded in the element 10, a pair of an external terminal 30 electrically connected to one end of the coil 20 and an external terminal 30 electrically connected to the other end of the coil 20, and conductive layers 40 each disposed on the surface of the element 10. The element 10 includes a bottom surface that crosses the winding axis of the coil 20 and that is near the mounting surface, an upper surface facing the bottom surface, and four side surfaces adjacent to the bottom and upper surfaces. The coil 20 includes a winding portion 21 and paired extended portions 22 extended from both ends of the winding portion 21. In the inductor 100, the conductive layers 40 are disposed on the upper surface, which crosses the winding axis of the coil 20 and faces away from the mounting surface, and the two side surfaces of the element that face each other. The end surfaces of the extended portions 22 are exposed from the other two side surfaces that face each other, on which the conductive layers are not disposed. The external terminals 30, which are electrically connected to the extended portions 22, are disposed on the other two side surfaces. The external terminal 30 extends from the side surface to the bottom surface of the element 10. In the inductor 100, the external terminal 30 is disposed on the entire side surface and on a portion of the bottom surface of the element 10. A portion of the external terminal 30 that is disposed on the bottom surface is illustrated in the partially transparent view in FIG. 2, but omitted in FIG. 1. For example, the external terminal 30 may be formed in the same manner as the conductive layers 40 and may be formed simultaneously with the conductive layers 40.

The element 10 may be formed by pressurizing a composite in which the coil 20 is embedded. The composite forming the element 10 may contain a magnetic metal powder and a binder, such as a resin. Examples of the magnetic metal powder include iron-based magnetic metal powders, such as magnetic iron (Fe) powders and Fe—Si-based, Fe—Si—Cr-based, Fe—Si—Al-based, Fe—Ni—Al-based, and Fe—Cr—Al-based magnetic metal powders, magnetic metal powders having compositions containing no iron, magnetic metal powders having other compositions containing iron, amorphous magnetic metal powders, magnetic metal powders including a surface covered by an insulator, such as glass, magnetic metal powders including a modified surface, and fine nanoscale magnetic metal powders. Examples of the binder include thermosetting resins, such as epoxy resins, polyimide resins, and phenol resins, and thermoplastic resins, such as polyester resins and polyamide resins.

The coil 20 is formed by edgewise winding of an insulation-coated conductor having a substantially rectangular cross section (hereinafter, also referred to as a flat wire) along the winding axis in a single direction. The insulation coating may include a polyurethane resin, a polyester resin, an epoxy resin, or a polyamide-imide resin. The coil 20 is contained in the element 10 with the winding axis crossing the bottom surface, which is near the mounting surface, and the upper surface of the element 10.

The conductive layer 40 includes a first metal layer and a second metal layer. The first metal layer is formed by melting and fusing together the magnetic metal powder, which is contained in the composite forming the element 10, near the surface of the element. The second metal layer is formed by using the first metal, which is used as a seed layer for plating, and disposed on the surface of the element 10. In the inductor 100, the conductive layers disposed on the upper surface and the side surfaces of the element 10 each have a substantially rectangular shape. The conductive layers are disposed on three continuous surfaces from the upper surface to the side surfaces. In the inductor 100, the conductive layers 40 each have a width narrower than the width of the element 10, the width being the dimension between the side surfaces from which the end surfaces of the extended portions 22 are exposed.

Figure 3A:
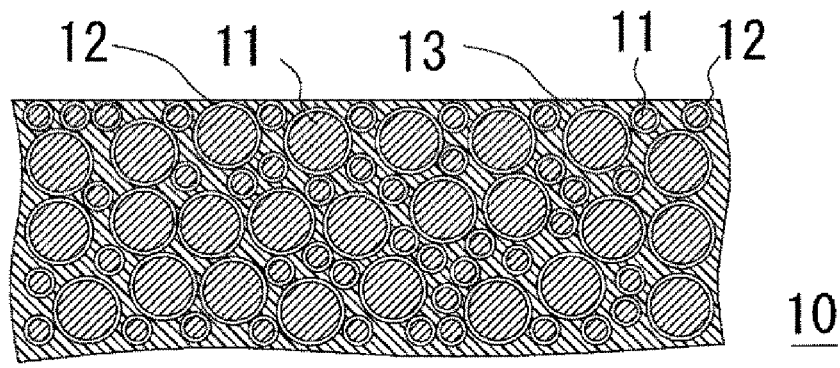
FIGS. 3A to 3C are schematic cross-sectional views illustrating a method for forming a conductive layer of the inductor illustrated in FIG. 1.

A method for forming the conductive layer will be described with reference to FIGS. 3A to 3C. FIG. 3A is a schematic cross-sectional view of a portion near the surface of the element 10. The element 10 is formed by pressure-molding a composite containing a resin 13 and a magnetic metal powder containing magnetic metal particles 11 covered by insulating layers 12. In FIG. 3A, the magnetic metal powder contains aggregates formed of at least two types of the magnetic metal particles 11, which differ from each other in average particle size and particle size distribution. The magnetic metal powder may contain aggregates formed of the magnetic metal particles 11 having a single average particle size and a single particle size distribution. When the magnetic metal powder contains the magnetic metal particles 11 having different average particle sizes, the density of the magnetic metal powder in the element 10 can be increased.

Figure 3B:
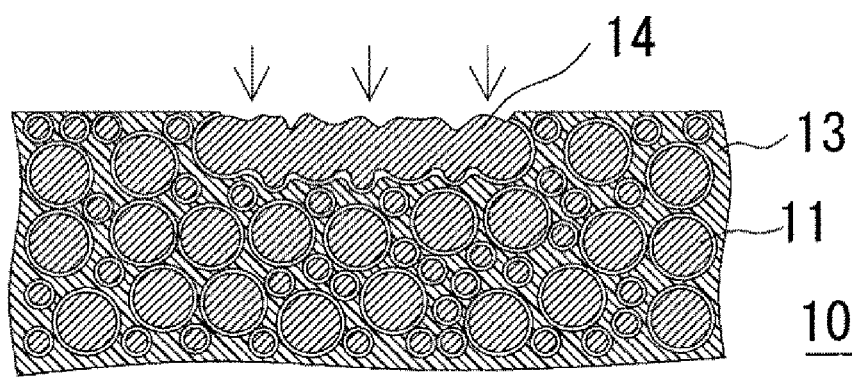

In FIG. 3B, for example, the surface of the element 10 is irradiated by a laser beam in the direction indicated by the arrows to form a first metal layer 14 near the surface of the element 10. Irradiating the surface of the element 10 with a laser beam removes a portion of the resin 13 in and near the surface of the element 10 and a portion of the insulating layers 12 on the periphery of the magnetic metal particles 11 in and near the surface. The laser beam melts the surfaces of the magnetic metal particles 11, and the magnetic metal particles 11 are fused together to form the first metal layer 14. In other words, the composition of the magnetic metal particles 11 and the composition of the first metal layer 14 are substantially the same. The first metal layer 14 is formed inward of the outermost surface of the element 10, and the surface of the first metal layer 14 is exposed to the outside of the element 10. The first metal layer 14 is formed of the magnetic metal particles 11 partially fused together. Accordingly, the first metal layer is thin and may be partially discontinuous. Therefore, the electrical resistivity of the first metal layer 14 is relatively increased in some cases. For example, a substantially annular first metal layer with a portion cut away (i.e., a substantially C-shaped first metal layer) having a conductor width of about 0.25 mm and a distance between the ends of the opening of about 0.5 mm is formed on a composite containing an iron powder used as the magnetic metal powder. In such a case, the electrical resistance of the first metal layer is about 14Ω when the diameter is about 9 mm and about 8Ω when the diameter is about 5 mm.

Figure 3C:
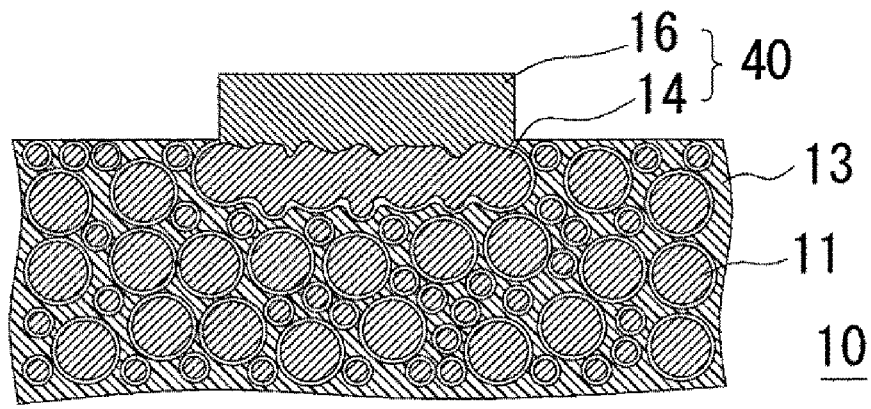

In FIG. 3C, a second metal layer 16 is formed on the first metal layer 14, which has been formed with the surface thereof exposed from the element 10, by plating to form the conductive layer 40. The second metal layer 16 is formed by growing the plating by using the first metal layer 14, which is a seed layer, and thus has a lower electrical resistivity than the first metal layer 14. For example, such a substantially C-shaped first metal layer having a conductor width of about 0.25 mm and a distance between the ends of the opening of about 0.5 mm is formed on a composite containing an iron powder used as the magnetic metal powder. Plating with copper is further performed to increase the thickness of the plating to about 52 μm. Such a conductive layer has an electrical resistance of about 36 mΩ when the diameter is about 9 mm and an electrical resistance of about 20 mΩ when the diameter is about 5 mm. The second metal layer may be protruded from the element 10.

The first metal layer included in a conductive layer disposed on the surface of the element of an inductor has a relatively high electrical resistivity, thereby suppressing generation of eddy current. On the other hand, the second metal layer has a relatively low electrical resistivity, and thus, the eddy current generated in the conductive layer is likely to flow in the second metal layer. Accordingly, a substantially conductive portion in the conductive layer is formed on only the surface of the element. Forming a conductive layer substantially on the surface of the element decreases the leakage flux of the inductor and reduces an eddy current loss.

Figure 4:
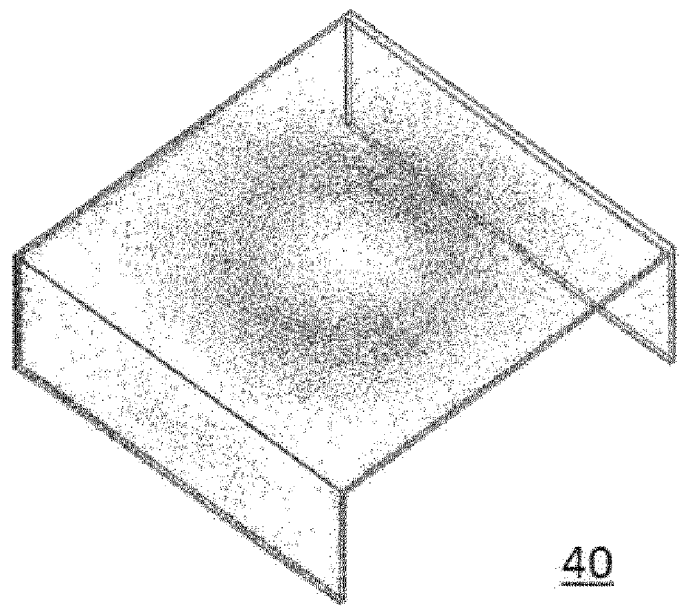
FIG. 4 is a perspective view illustrating a distribution of eddy current generated in the conductive layers of the inductor illustrated in FIG. 1.

In the above example, conductive layers are formed on substantially all area of the three surfaces of the element. Thus, in some cases, it is difficult to efficiently produce the conductive layers by irradiating with a laser beam. To efficiently produce the conductive layers, the area of the conductive layers is preferably decreased as far as possible. FIG. 4 is the simulation result of the distribution of eddy current generated in the conductive layers 40 when a current of 5 A flows at 1 MHz in the coil 20 of the inductor 100 in Example 1. The simulation was performed with the coil having an outer diameter of about 9 mm and an inner diameter of about 5 mm by using finite element analysis software Femtet (tradename) commercially available from Murata Software Co., Ltd. In FIG. 4, the eddy current is mainly generated in a substantially annular region overlapping the winding portion 21 of the coil 20 in a plan view when viewed in the direction of the winding axis of the coil. Therefore, forming a substantially annular conductive layer on the upper surface of the element in accordance with an eddy current distribution determined by performing the simulation enables a reduction in most of the leakage flux.

Example 2

Figure 5:
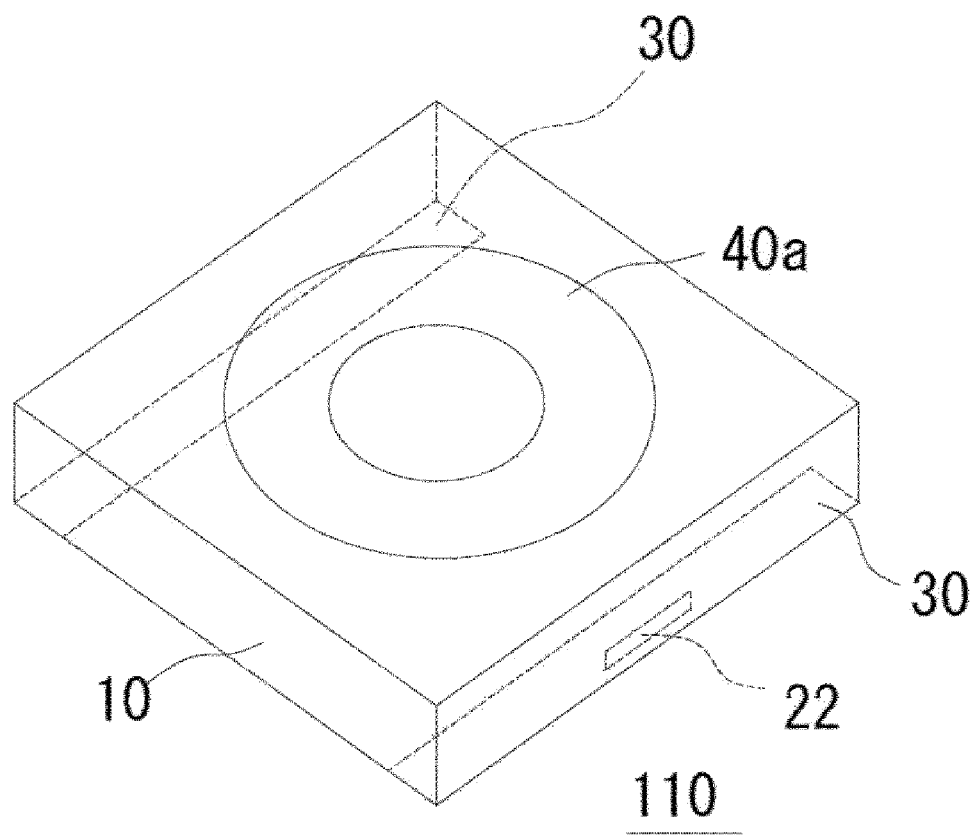
FIG. 5 is a schematic, partially transparent perspective view of an inductor in Example 2.

An inductor 110 in Example 2 will be described with reference to FIG. 5. FIG. 5 is a schematic, partially transparent perspective view of the inductor 110. The coil contained in the element 10 is not shown. The inductor 110 is configured in the same manner as the inductor 100, except that a conductive layer 40a is disposed as a substantially annular conductive layer on the upper surface of the element 10 and that no conductive layers are disposed on the side surfaces.

In the inductor 110, when viewed in the direction of the winding axis of the coil, the conductive layer 40a formed in a substantially annular shape is substantially aligned with the winding portion 21 of the coil. Disposing the conductive layer 40a in only a region where the leakage flux generated from the coil is high leads to a sufficient effect of reducing the leakage flux and enables a reduction in the area of the conductive layer 40a. Such a reduction increases the productivity of the conductive layer.

In the inductor according to preferred embodiments of the present disclosure, the conductive layer is disposed substantially on the surface of the element. The reason why such a disposition enables a reduction in the leakage flux of the inductor and a reduction in an eddy current loss can be described as follows.

The magnetic flux density in a plane a predetermined distance away from the surface of the element of the inductor in the direction of the winding axis of the coil is measured. The leakage flux can be evaluated by using the maximum magnetic flux density in the plane. In other words, a low maximum magnetic flux density means that the leakage flux emanating from the inductor is low. On the other hand, the eddy current loss cannot be directly measured. When the magnetic flux generated from the coil crosses the conductive layer, eddy current is generated in the conductive layer. Due to the eddy current, secondary magnetic flux is generated in a direction opposite to that of the original magnetic flux generated from the coil. The magnetic flux generated from the coil is partially cancelled by the secondary magnetic flux generated by the eddy current, thereby decreasing the inductance value. The higher the eddy current, the lower the inductance value. Thus, the magnitude of the eddy current loss can be indirectly evaluated by using a change in the inductance value. In other words, a small change in the inductance value means that the eddy current loss is low.

Regarding an inductor including a substantially annular conductive layer, such as the inductor 110, the relation between the position of the conductive layer and the maximum magnetic flux density B max and the relation between the position of the conductive layer and the inductance value were evaluated by performing a simulation. The results are summarized in Table 1. The winding portion of a coil had an inner diameter of about 5 mm and an outer diameter of about 9 mm. The conductive layer had a substantially annular shape with a thickness of about 50 μm and was disposed above the winding portion of the coil so as to overlap the winding portion when viewed in the direction of the winding axis of the coil. Under such conditions, the simulation was performed with the position of the conductive layer changed by every 50 μm from the surface of the element to a depth of 150 μm. The current that flows in the coil was set to 1 MHz/5 A. The maximum magnetic flux density in a plane 0.5 mm away from the upper surface of the element in the direction of the winding axis of the coil and the maximum magnetic flux density in a plane 1.0 mm away from the upper surface of the element in the direction of the winding axis of the coil were calculated. Table 1 shows the change in inductance value L (%) relative to the inductance value L of Comparative Example (100%), in which the conductive layer 40a is not formed in the inductor, and the maximum magnetic flux density B max (%) relative to the maximum magnetic flux density of the inductor in Comparative Example (100%). The simulation was performed by using Femtet.

TABLE 1

| | | Depth of conductive layer | | | |
| --- | --- | --- | --- | --- | --- |
| | | Surface | 50 μm | 100 μm | 150 μm |
| Change in L (%) | | −2.14 | −3.33 | −4.67 | −6.15 |
| Bmax Relative value (%) | $Z = 0.5$ mm | 38.39 | 38.73 | 35.82 | 35.24 |
| | $Z = 1.0$ mm | 30.10 | 29.01 | 28.49 | 27.48 |

Table 1 shows that the maximum magnetic flux density B max decreases regardless of the depth of the substantially annular conductive layer in the element. Thus, providing a conductive layer enables a reduction in the leakage flux of the inductor. On the other hand, the absolute values of the percentage changes in inductance value L significantly increase in accordance with the depth of the substantially annular conductive layer in the element. When the substantially annular conductive layer is embedded in the element, the inductance of the substantially annular conductive layer increases, and the magnetic coupling between the winding portion of the coil and the substantially annular conductive layer increases. This increases the eddy current loss, and thus, such a significant increase in inductance value L is likely to be caused. Therefore, disposing a conductive layer nearer to the element surface reduces the eddy current loss.

Example 3

Figure 6:
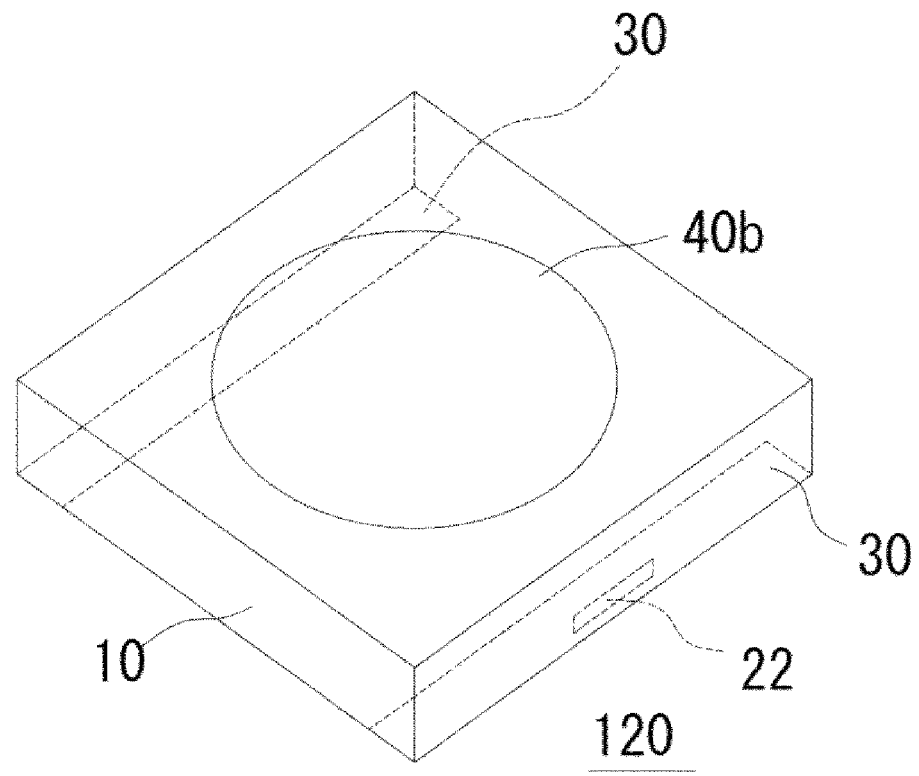
FIG. 6 is a schematic, partially transparent perspective view of an inductor in Example 3.

An inductor 120 in Example 3 will be described with reference to FIG. 6. FIG. 6 is a schematic, partially transparent perspective view of the inductor 120. The inductor 120 is configured in the same manner as the inductor 100, except that a substantially disk-shaped conductive layer 40b having an outer diameter substantially identical to the outer diameter of the winding portion of the coil is disposed on the upper surface of the element 10 and that no conductive layers are disposed on the side surfaces of the element 10.

In the inductor 120, when viewed in the direction of the winding axis of the coil, the outer periphery of the substantially disk-shaped conductive layer 40b is substantially aligned with the outer periphery of the winding portion of the coil embedded in the element 10. Disposing the conductive layer 40b in only a region where the leakage flux generated from the coil is high leads to a sufficient effect of reducing the leakage flux and enables a reduction in the area of the conductive layer 40b. Such a reduction further increases the productivity of the conductive layer.

Example 4

Figure 7:
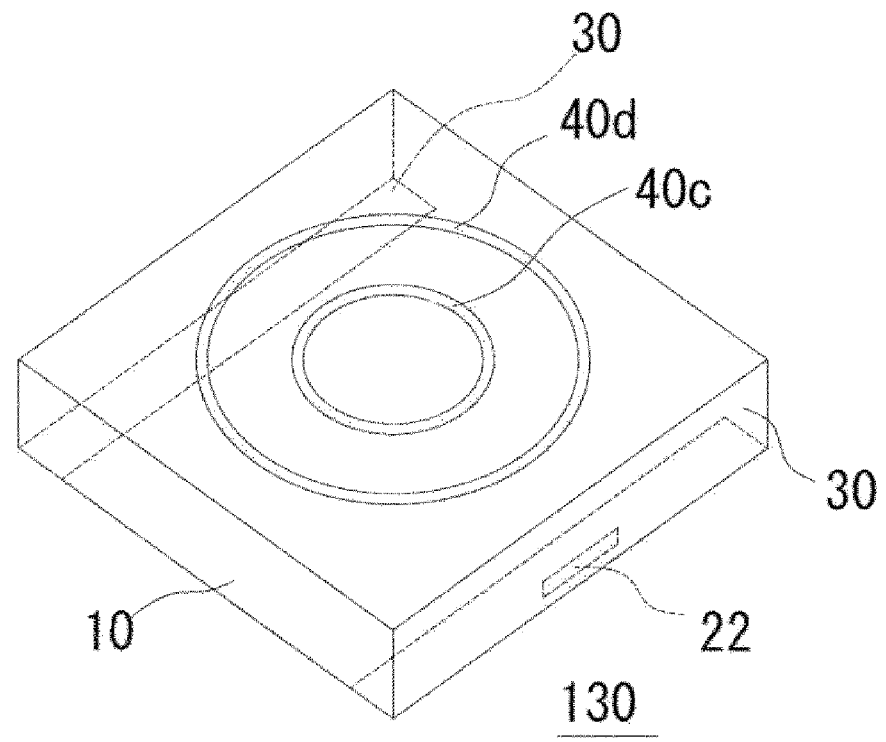
FIG. 7 is a schematic, partially transparent perspective view of an inductor in Example 4.

An inductor 130 in Example 4 will be described with reference to FIG. 7 to FIG. 9. FIG. 7 is a schematic, partially transparent perspective view of the inductor 130. The inductor 130 is configured in the same manner as the inductor 100, except that a substantially annular conductive layer 40c, which is above the inner periphery of the winding portion of the coil and substantially aligned therewith, and a substantially annular conductive layer 40d, which is above the outer periphery of the winding portion of the coil and substantially aligned therewith, are disposed on the upper surface of the element 10, and that no conductive layers are disposed on the side surfaces of the element 10. The inductor 130 is configured in the same manner as the inductor 110, except that the substantially annular conductive layer 40a, which is the single conductive layer of the inductor 110, is divided into the substantially annular conductive layer 40c disposed above the inner periphery of the winding portion of the coil and the substantially annular conductive layer 40d disposed above the outer periphery of the winding portion of the coil and that no conductive layer is disposed between the conductive layers 40c and 40d.

In the inductor 130, when viewed in the direction of the winding axis of the coil, the inner diameter of the substantially annular conductive layer 40c is substantially identical to the inner diameter of the winding portion of the coil embedded in the element 10. The outer diameter of the substantially annular conductive layer 40d is substantially identical to the outer diameter of the winding portion of the coil embedded in the element 10. The conductive layers 40c and 40d are disposed concentrically with the winding axis of the coil at the center. Disposing the conductive layers 40c and 40d in only a region where the leakage flux generated from the coil is particularly high enables a reduction in the area of the conductive layers and leads to a sufficient effect of reducing the leakage flux. The conductor width of the conductive layer 40c is about 0.25 mm, for example, when the inner diameter of the winding portion of the coil is about 5 mm and the outer diameter is about 9 mm.

Figure 8:
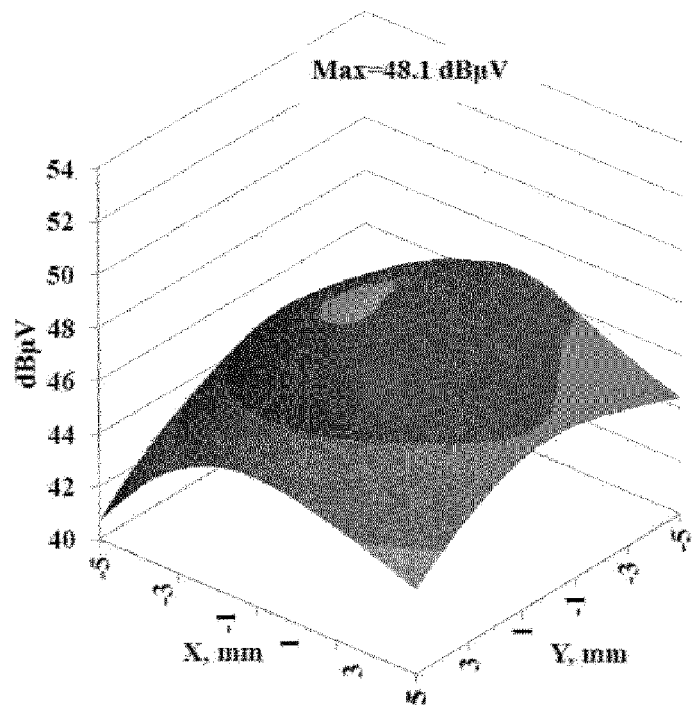
FIG. 8 illustrates the distribution of magnetic field noise of the inductor illustrated in FIG. 7.
Figure 9:
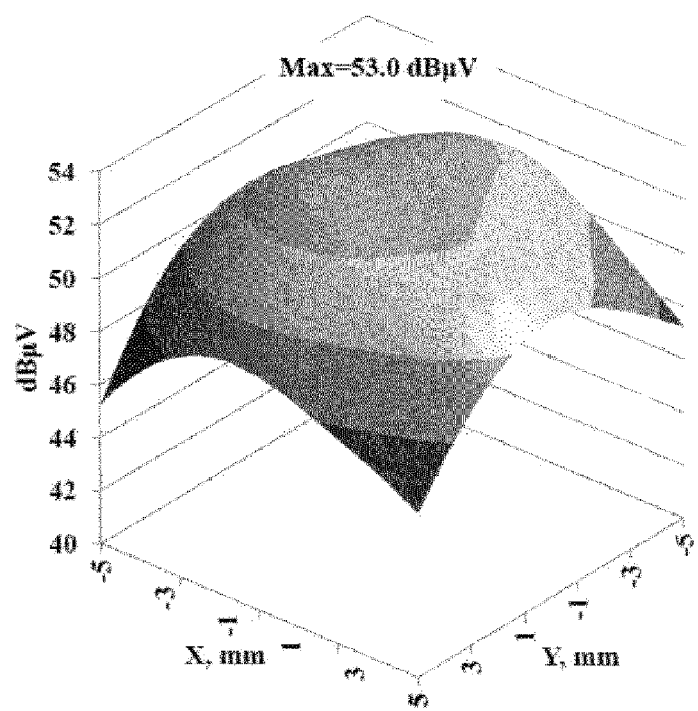
FIG. 9 illustrates the distribution of magnetic field noise of an inductor having no conductive layers.

FIG. 8 and FIG. 9 are graphs of the actual measurement results of the magnetic field noise generated by the inductor. FIG. 8 shows a measurement result of the inductor 130 in Example 4. FIG. 9 shows a measurement result of an inductor having no substantially annular conductive layers, for comparison. The measurement was performed by mounting the inductor on a DC-DC converter driven at 1 MHz and measuring the distribution of the excitation voltage generated by the magnetic field noise in a plane 1 mm away from the upper surface of the inductor by using an EMI tester (EMV-100, Peritec Corporation). In FIG. 8 and FIG. 9, the x-axis and the y-axis represent positions on the inductor relative to the winding axis of the coil, and the vertical axis represents the excitation voltage. In the inductor used in the measurement, the winding portion of the coil had an inner diameter of about 5 mm and an outer diameter of about 9 mm. The substantially annular conductive layers 40c and 40d each had a conductor width of about 0.25 mm.

As illustrated in FIG. 9, the inductor for comparison having no substantially annular conductive layers has a maximum excitation voltage of about 53 dBμV. On the other hand, as illustrated in FIG. 8, the inductor 130 in Example 4 has a maximum excitation voltage of about 48.1 dBμV, and the difference in excitation voltage is 4.9 dBμV. In other words, disposing two substantially annular conductive layers concentrically reduces about 44% of the magnetic field noise.

Example 5

Figure 10:
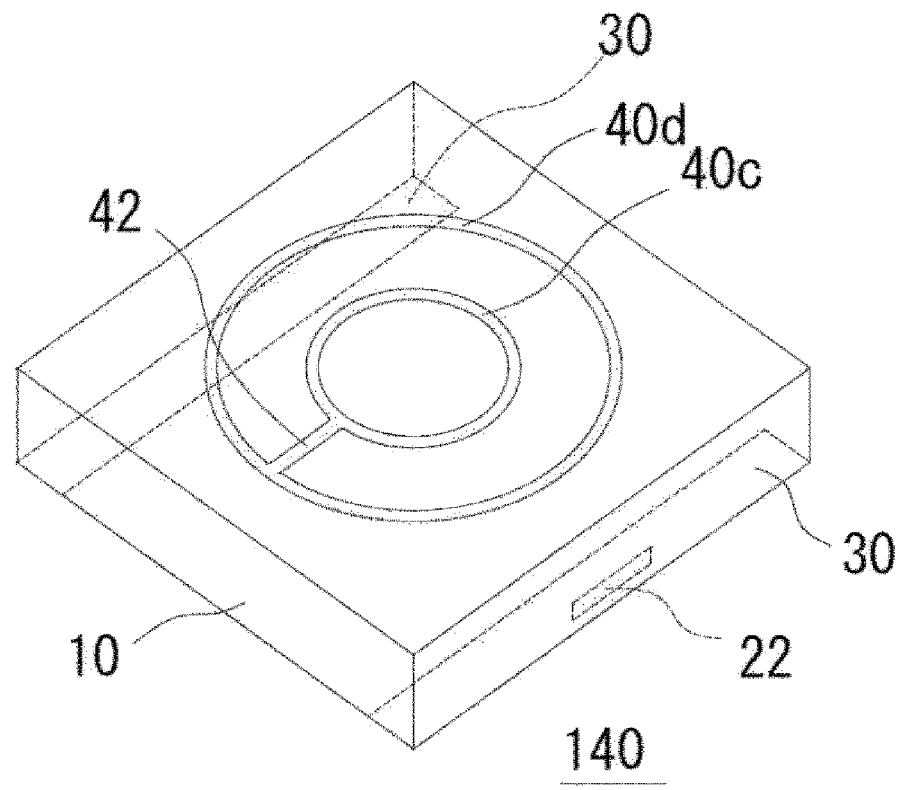
FIG. 10 is a schematic, partially transparent perspective view of an inductor in Example 5.

An inductor 140 in Example 5 will be described with reference to FIG. 10. FIG. 10 is a schematic, partially transparent perspective view of the inductor 140. The inductor 140 is configured in the same manner as the inductor 100, except that the substantially annular conductive layer 40c, which is above the inner periphery of the winding portion of the coil and substantially aligned therewith, and the substantially annular conductive layer 40d, which is above the outer periphery of the winding portion of the coil and substantially aligned therewith, are disposed on the upper surface of the element 10, that the conductive layer 40c and the conductive layer 40d are electrically connected to each other by a connecting conductor 42, and that no conductive layers are disposed on the side surfaces of the element 10. The inductor 140 is configured in the same manner as the inductor 130, except that the conductive layers 40c and 40d of the inductor 130 are electrically connected to each other by the connecting conductor 42.

In the inductor 140, when viewed in the direction of the winding axis of the coil, the substantially annular conductive layer 40c is disposed with the inner periphery thereof substantially aligned with the inner periphery of the winding portion of the coil embedded in the element 10. The substantially annular conductive layer 40d is disposed with the outer periphery thereof substantially aligned with the outer periphery of the winding portion of the coil embedded in the element 10. The conductive layers 40c and 40d are disposed concentrically with the winding axis of the coil at the center and electrically connected to each other by the connecting conductor 42. For example, the connecting conductor 42 may be formed in the same manner as the conductive layers 40c and 40d and may be formed simultaneously with the conductive layers 40c and 40d.

The second metal layers in the conductive layers 40c and 40d are formed by, for example, electroplating. The inductor 130 includes a plurality of first metal layers to be plated, and thus, the productivity of electroplating is degraded in some cases. The inductor 140 includes a plurality of first metal layers electrically connected to each other by the connecting conductor 42. In accordance with such a structure, the contact between a portion to be plated and metal balls increases in a barrel plating method, and only a single connecting point is needed in a method in which plating is performed by connecting a portion to be plated and the electrode to each other. Thus, the second metal layer can be efficiently formed. If an eddy current flows in the substantially annular conductive layer, the effect of reducing the leakage flux is not affected since the portion between the conductive layers is in an electrically floating state.

Example 6

Figure 11:
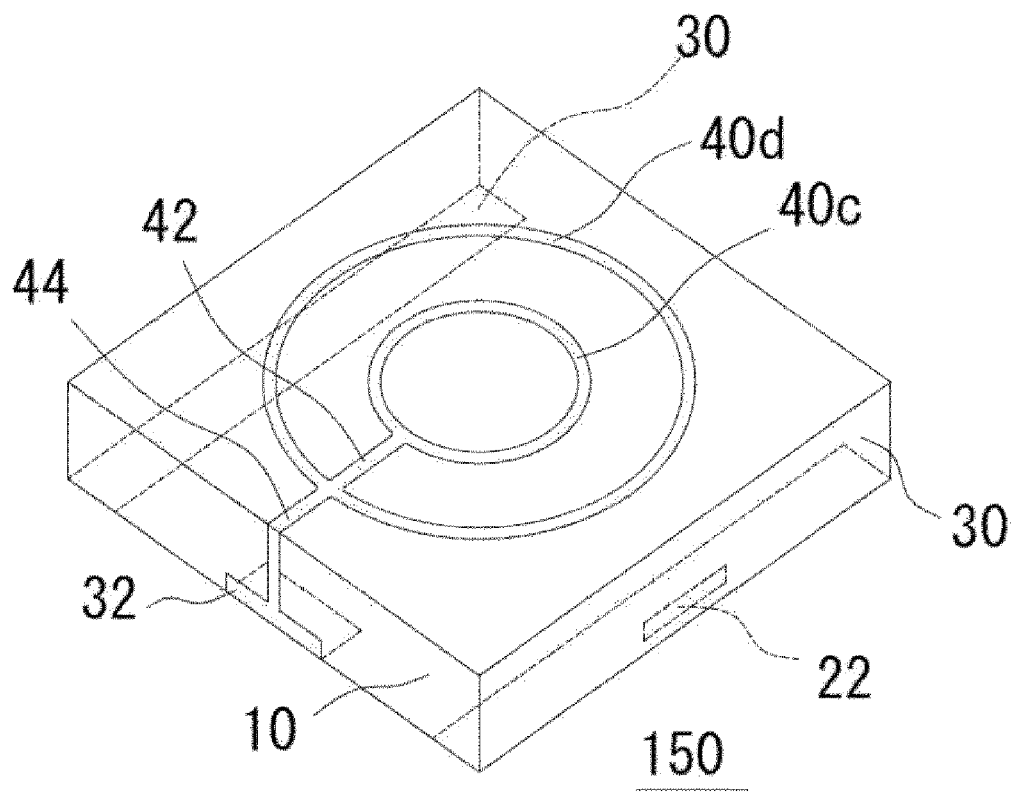
FIG. 11 is a schematic, partially transparent perspective view of an inductor in Example 6.

An inductor 150 in Example 6 will be described with reference to FIG. 11. FIG. 11 is a schematic, partially transparent perspective view of the inductor 150. The inductor 150 is configured in the same manner as the inductor 100, except that the substantially annular conductive layer 40c, which is above the inner periphery of the winding portion of the coil and substantially aligned therewith, and the substantially annular conductive layer 40d, which is above the outer periphery of the winding portion of the coil and substantially aligned therewith, are disposed on the upper surface of the element 10, that the conductive layer 40c and the conductive layer 40d are electrically connected to each other by the connecting conductor 42, that the conductive layers 40c and 40d are electrically connected to a ground terminal 32 through a connecting conductor 44, and that no conductive layers are disposed on the side surfaces of the element 10. The inductor 150 is configured in the same manner as the inductor 140, except that the conductive layers 40c and 40d of the inductor 140 are electrically connected to the ground terminal 32 through the connecting conductor 44.

In the inductor 150, the ground terminal 32 to be connected to a ground on a substrate where the inductor is to be mounted is continuously disposed on the bottom surface of the element 10 and a side surface that is adjacent to the bottom surface and where the end portion of the coil is not exposed. For example, the ground terminal 32 may be formed in the same manner as the conductive layers 40c and 40d and may be formed simultaneously with the conductive layers 40c and 40d. The ground terminal 32 is connected to the conductive layer 40d through the connecting conductor 44 continuously disposed on the upper and side surfaces of the element 10. The conductive layer 40d is connected to the conductive layer 40c through the connecting conductor 42. For example, the connecting conductor 44 may be formed in the same manner as the conductive layers 40c and 40d and may be formed simultaneously with the conductive layers 40c and 40d. Connecting the conductive layers 40c and 40d to the ground reduces the electric field noise in addition to electromagnetic noise generated by the leakage flux.

Regarding the inductor 100 in Example 1 to the inductor 130 in Example 4, the change in inductance value L, the maximum magnetic flux density B max in a plane 0.5 mm away from the upper surface of the inductor in the direction of the winding axis of the coil, and the maximum magnetic flux density B max in a plane 1.0 mm away from the upper surface of the inductor in the direction of the winding axis of the coil were evaluated by performing the simulation, and the results are summarized in Table 2. The winding portions of the coils embedded in the elements had an inner diameter of about 5.0 mm and an outer diameter of about 9.0 mm.

The inductor 100 in Example 1 includes substantially rectangular conductive layers that cover the upper and two side surfaces of the element and that are continuously disposed on the surfaces with a thickness of about 50 μm, as illustrated in FIG. 2. The inductor 110 in Example 2 includes a single substantially annular conductive layer that has a wide conductor width and a thickness of about 50 μm and that has a shape and a size identical to those of the winding portion when viewed in the direction of the winding axis of the winding portion, as illustrated in FIG. 5. The inductor 120 in Example 3 includes a substantially disk-shaped conductive layer that has a diameter identical to the outer diameter of the winding portion and a thickness of about 50 μm, as illustrated in FIG. 6. The inductor 130 in Example 4 includes two substantially annular conductive layers having a conductor width of about 0.25 mm and a thickness of about 50 μm, as illustrated in FIG. 7. The outer conductive layer has an outer diameter identical to the outer diameter of the winding portion. The inner conductive layer has an inner diameter identical to the inner diameter of the winding portion.

Table 2 shows the change in inductance value L (%) relative to the inductance value L of Comparative Example (100%), in which the conductive layer is not formed in the inductor, and the maximum magnetic flux density B max (%) relative to the maximum magnetic flux density of the inductor in Comparative Example (100%). The simulation was performed by using Femtet with the coil current set to 1 MHz/5 A.

TABLE 2

|  |  | Example 1 | Example 2 | Example 3 | Example 4 |
|---|---|---|---|---|---|
| Change in L (%) | | −2.57 | −2.14 | −2.29 | −1.67 |
| Bmax | Z = 0.5 mm | 33.6 | 38.4 | 37.4 | 52.0 |
| Relative value (%) | Z = 1.0 mm | 16.4 | 30.1 | 28.1 | 38.3 |

Table 2 shows that the effect of reducing the leakage flux is enhanced in the order of the inductor in Example 4, the inductor in Example 2, the inductor in Example 3, and the inductor in Example 1, and the absolute value of the percentage change in inductance value L increases in such an order. It has been found that the effect of reducing the leakage flux and the reduction in eddy current loss are unlikely to be compatible with each other when a conductive layer is disposed on the surface of the inductor element. In other words, in accordance with the characteristics of the leakage flux and the power loss, which are required for the inductor, the pattern of the conductive layer can be chosen from various patterns of the conductive layer. Adjusting the thickness of the second metal layer enables adjustment of the electrical resistivity of the second metal layer and adjustment of the balance between the effect of reducing the leakage flux and a reduction in the eddy current loss, without changing the shape of the conductive layer.

In the above Examples, the coil was formed by edgewise winding of a conductor and had a substantially circular winding portion when viewed in the direction of the winding axis of the coil. However, the winding portion may have another shape, when viewed in the direction of the winding axis of the coil, such as an elliptic, rectangular, running-track, or oval shape. The winding is not limited to edgewise winding and may be another winding, such as α winding. The coil may be formed by stacking conductor patterns.

In FIG. 5 and FIG. 6, the outline of the conductive layer is a substantially circular shape; however, the outline of the conductive layer may be another shape, such as an elliptic, rectangular, running-track, or oval shape, in accordance with the shape of the winding portion of the coil.

In FIG. 7, FIG. 10, and FIG. 11, two substantially annular conductive layers are used; however, more than two substantially annular conductive layers may be used.

An insulating layer may be further disposed on the conductive layer. Due to the insulating layer, the effect of preventing short circuits between the conductive layer and the terminal of the coil conductor is exhibited in addition to the effect of suppressing the oxidation of the conductive layer.

In the above Examples, a conductive layer is disposed on the upper surface of the element; however, a conductive layer is further disposed on the bottom surface, which is near the mounting surface, of the element. Typically, regarding an inductor mounted on a substrate, the substrate includes a conductor pattern near the inductor or on the rear surface, and thus, the leakage flux of the inductor is blocked. In other cases, such as a case in which a substrate includes a small number of conductor patterns, disposing a conductive layer on the bottom surface of the element reduces the leakage flux emitted from the bottom surface of the inductor.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An inductor, comprising;
an element containing a magnetic metal powder and a resin;
a coil that includes a winding portion and paired extended portions extended from both ends of the winding portion, and that is embedded in the element;
a pair of an external terminal electrically connected to one of the extended portions and an external terminal electrically connected to another of the extended portions; and
a conductive layer disposed on a surface of the element that crosses a winding axis of the coil,
wherein the conductive layer includes a first metal layer formed by fusing together the magnetic metal powder inside the element and a second metal layer formed by plating near the surface of the element and on the first metal layer, and an electrical resistivity of the second metal layer is lower than an electrical resistivity of the first metal layer.

2. The inductor according to claim 1, wherein the first metal layer is formed inside the element.

3. The inductor according to claim 1, wherein the conductive layer is disposed to overlap at least a portion of the winding portion when viewed in a direction of the winding axis of the coil.

4. The inductor according to claim 1, wherein the conductive layer is disposed inward of an outer periphery of the winding portion when viewed in a direction of the winding axis of the coil.

5. The inductor according to claim 1, wherein the conductive layer includes a substantially annular conductive layer disposed between the outer periphery and an inner periphery of the winding portion when viewed in a direction of the winding axis of the coil.

6. The inductor according to claim 5, wherein the conductive layer includes a plurality of substantially annular conductive layers that do not cross each other.

7. The inductor according to claim 6, wherein the plurality of substantially annular conductive layers are electrically connected to each other.

8. The inductor according to claim 1, further comprising a ground terminal to be connected to a ground of a substrate where the inductor is to be mounted, wherein the conductive layer is electrically connected to the ground terminal.

9. The inductor according to claim 1, further comprising an insulating layer covering the conductive layer.

10. The inductor according to claim 2, wherein the conductive layer is disposed to overlap at least a portion of the winding portion when viewed in a direction of the winding axis of the coil.

11. The inductor according to claim 2, wherein the conductive layer is disposed inward of an outer periphery of the winding portion when viewed in a direction of the winding axis of the coil.

12. The inductor according to claim 3, wherein the conductive layer is disposed inward of an outer periphery of the winding portion when viewed in the direction of the winding axis of the coil.

13. The inductor according to claim 2, wherein the conductive layer includes a substantially annular conductive layer disposed between the outer periphery and an inner periphery of the winding portion when viewed in a direction of the winding axis of the coil.

14. The inductor according to claim 3, wherein the conductive layer includes a substantially annular conductive layer disposed between the outer periphery and an inner periphery of the winding portion when viewed in the direction of the winding axis of the coil.

15. The inductor according to claim 4, wherein the conductive layer includes a substantially annular conductive layer disposed between the outer periphery and an inner periphery of the winding portion when viewed in the direction of the winding axis of the coil.

16. The inductor according to claim 2, further comprising a ground terminal to be connected to a ground of a substrate where the inductor is to be mounted, wherein the conductive layer is electrically connected to the ground terminal.

17. The inductor according to claim 3, further comprising a ground terminal to be connected to a ground of a substrate where the inductor is to be mounted, wherein the conductive layer is electrically connected to the ground terminal.

18. The inductor according to claim 2, further comprising an insulating layer covering the conductive layer.

19. The inductor according to claim 3, further comprising an insulating layer covering the conductive layer.

\* \* \* \* \*